United States Patent
Poduska

(10) Patent No.: US 11,169,942 B1
(45) Date of Patent: Nov. 9, 2021

(54) DOUBLE DATA RATE (DDR) RADIO FREQUENCY (RF) DIGITIZATION MODULE FOR SOFTWARE-DEFINED RADIO (SDR)

(71) Applicant: Rockwell Collins, Inc., Cedar Rapids, IA (US)

(72) Inventor: Matthew J. Poduska, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 16/681,466

(22) Filed: Nov. 12, 2019

(51) Int. Cl.
*G06F 13/16* (2006.01)
*G11C 11/4093* (2006.01)
*G11C 11/4096* (2006.01)
*H04B 1/00* (2006.01)

(52) U.S. Cl.
CPC ...... *G06F 13/1689* (2013.01); *G11C 11/4093* (2013.01); *G11C 11/4096* (2013.01); *H04B 1/0025* (2013.01)

(58) Field of Classification Search
CPC .................................................. H04B 1/0025
See application file for complete search history.

(56) References Cited

U.S. PATENT DOCUMENTS

| 8,395,539 | B2 | 3/2013 | Lim et al. |
| 9,184,753 | B2 | 11/2015 | Shin |
| 9,191,011 | B2 | 11/2015 | Hwang |
| 9,600,288 | B1* | 3/2017 | Potter .................. G06F 9/3887 |
| 9,774,332 | B2 | 9/2017 | Lee et al. |
| 10,103,184 | B2 | 10/2018 | Hwang |
| 2004/0025052 | A1* | 2/2004 | Dickenson ............ H04L 63/105 726/4 |
| 2005/0270567 | A1* | 12/2005 | Du ..................... H04N 1/32502 358/1.15 |
| 2010/0023595 | A1* | 1/2010 | McMillian .............. G06F 15/17 709/212 |
| 2011/0122274 | A1 | 5/2011 | Itzhak et al. |

(Continued)

FOREIGN PATENT DOCUMENTS

| EP | 2241010 B1 | 2/2018 |
| KR | 10173393 B1 | 5/2017 |
| WO | 2018141362 A1 | 8/2018 |

*Primary Examiner* — Idriss N Alrobaye
*Assistant Examiner* — Ronald T Modo
(74) *Attorney, Agent, or Firm* — Suiter Swantz pc llo

(57) ABSTRACT

A double data rate (DDR) RF digitization module for a software defined radio (SDR) is disclosed. In embodiments, the DDR RF digitization module includes a printed circuit board (PCB) terminating in a DDR memory bus interface comprising a plurality of input/output (I/O) connectors insertable into a DDR slot of an SDR motherboard. The RF digitization module is connectable to an RF front end of the SDR via receiver-side (Rx) and transmitter-side (Tx) RF connectors. The RF digitization module includes DDR analog-digital converters (ADC) and digital-analog converters (DAC) mounted to the PCB and in communication with the RF front end and the DDR memory bus. The DDR ADCs provide high speed digital sampling of inbound RF signals for the signal processors via the DDR memory bus, and the DDR DACs provide high speed generation of transmittable analog RF signals based on digital spectrum data generated by the signal processors.

12 Claims, 2 Drawing Sheets

(56) References Cited

U.S. PATENT DOCUMENTS

| | | | |
|---|---|---|---|
| 2013/0196609 A1* | 8/2013 | Ancora | H04B 15/04 |
| | | | 455/78 |
| 2017/0093277 A1* | 3/2017 | Wasserman | H02M 7/53871 |
| 2017/0237419 A1* | 8/2017 | Clara | H03M 1/06 |
| | | | 327/231 |
| 2017/0317021 A1* | 11/2017 | Iyoshi | H03M 11/24 |
| 2018/0181084 A1* | 6/2018 | Yonemoto | G06F 11/30 |
| 2019/0013817 A1 | 1/2019 | Koli | |
| 2020/0153535 A1* | 5/2020 | Jayaweera Kankanamge | |
| | | | G06N 3/006 |

\* cited by examiner

DOUBLE DATA RATE (DDR) RADIO FREQUENCY (RF) DIGITIZATION MODULE FOR SOFTWARE-DEFINED RADIO (SDR)

BACKGROUND

Software-defined radio (SDR) devices provide for radio frequency (RF) communications (transmission and receipt of messages) by implementing some functionalities generally associated with analog circuitry or components (e.g., signal amplification and filtering, modulation/demodulation) via software executable on a processor. For example, signal processing operations may be carried out in a commercial off the shelf (COTS) processing environment, i.e., by one or more COTS processors or processing cores. In such an environment, as bandwidth increases, digital interfaces (e.g., PCI Express (PCIe)) between the digital conversion elements (analog/digital converters (ADC) and digital/analog converters (DAC) and SDR applications running on the signal processors may experience latency issues. Excess latency on the part of the digital interfaces may in turn inhibit SDR application functionalities, e.g., higher communication data rates, optimal spectrum sensing capabilities, or efficient frequency hopping through a larger portion of the RF spectrum.

SUMMARY

A double data rate (DDR) radio frequency (RF) digitization module is disclosed. In embodiments, the DDR RF digitization module includes a printed control board (PCB) terminating in a DDR memory bus interface (which may comprise any number of input/output (I/O) pins or connectors) insertable in a motherboard and connectable to a DDR memory bus. The DDR RF digitization module connects to an RF front end or signal source via receiver-side (Rx) and transmitter-side (Tx) connectors. The DDR RF digitization module includes, mounted to the PCB, DDR analog-digital converters (ADC) connected to the DDR memory bus interface and the RxRF connector. The DDR ADCs sample and digitize inbound RF signals, appearing to software defined radio (SDR) signal processors as a DDR memory module with respect to read or write operations. Similarly, the DDR RF digitization module includes DDR digital-analog converters (DAC) connected to the DDR memory bus interface and the TxRF connector and capable of sampling at DDR speed digital signals generated by the SDR signal processors and outputting the resulting RF signals for transmission.

A software-defined radio (SDR) is also disclosed. In embodiments, the SDR includes antenna elements for receiving and transmitting inbound and outbound RF signals. The SDR includes an RF front end with additional signal processing circuitry. The SDR includes a motherboard assembly; incorporated in the motherboard assembly are SDR signal processors and double data rate (DDR) memory slots capable of accepting memory modules and connecting the inserted memory modules to a DDR memory bus. The SDR includes a DDR RF digitization module embodied in a module insertable in a DDR memory slot and capable of appearing to the signal processors as a DDR memory module for purposes of read/write operations. The DDR RF digitization module includes a printed control board (PCB) terminating in a DDR memory interface insertable in the DDR memory slot. The DDR RF digitization module connects to the RF front end via receiver-side (Rx) and transmitter-side (Tx) connectors. The DDR RF digitization module includes, mounted to the PCB, DDR analog-digital converters (ADC) connected to the DDR memory bus interface and the RxRF connector and capable of sampling and digitizing inbound RF signals. Similarly, the DDR RF digitization module includes DDR digital-analog converters (DAC) connected to the DDR memory bus interface and the TxRF connector and capable of sampling at DDR speed digital signals generated by the signal processors and outputting the resulting RF signals to the RF front end for transmission.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1:
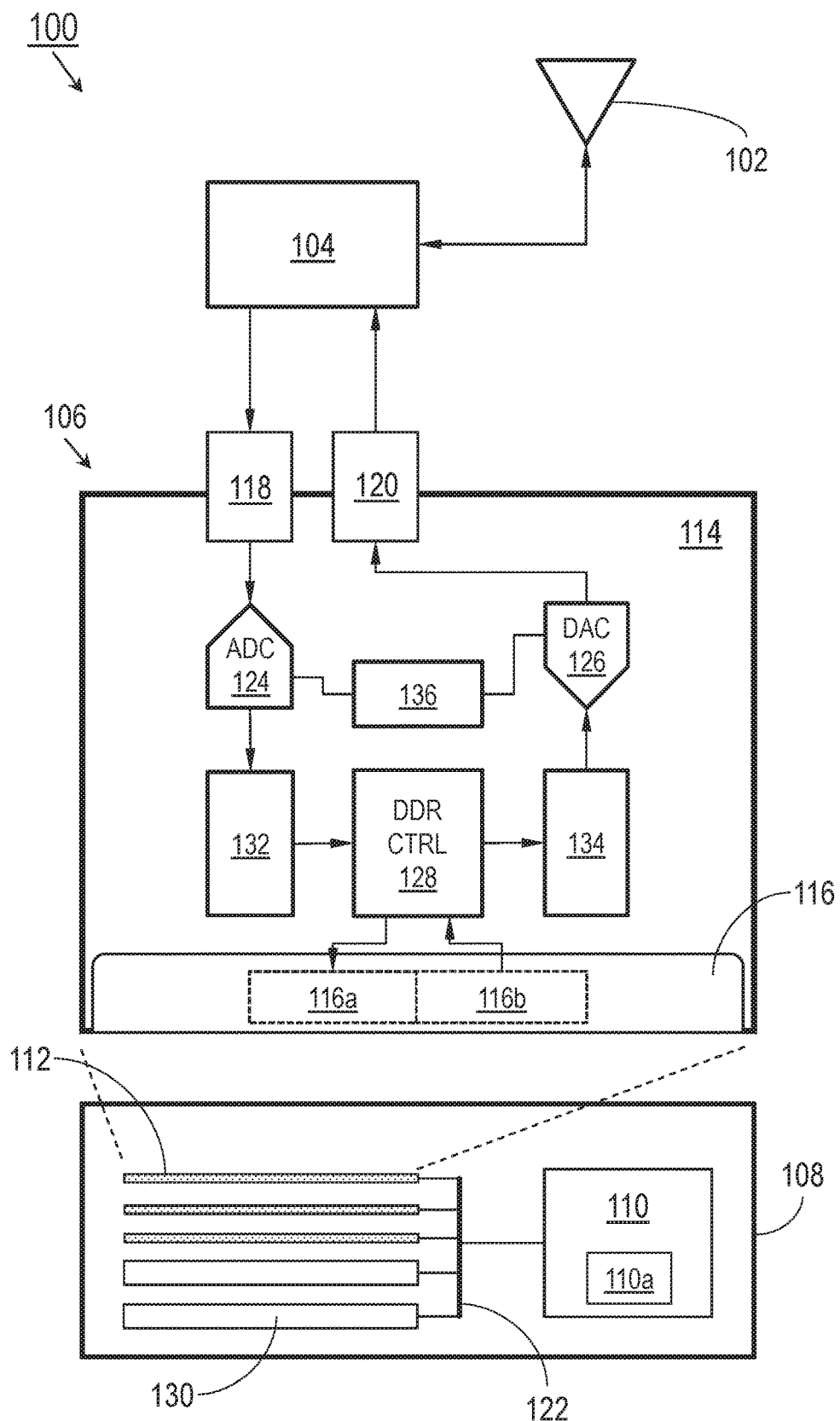
FIG. 1 is a block diagram illustrating a software defined radio (SDR) environment in accordance with example embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following:

A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Referring to FIG. 1, a software-defined radio (SDR) environment 100 is disclosed. The SDR environment 100 may include antenna elements 102, a radio frequency (RF) front end 104, a double data rate (DDR) RF digitization module 106 (e.g., signal capture module), and a motherboard 108 including one or more signal processors 110 mounted thereto and one or more DDR memory slots 112.

In embodiments, the signal processors 110 may be commercial off-the-shelf (COTS) processing units programmed to execute various SDR applications (e.g., spectrum sensing, frequency hopping, waveforms, protocols). For example, inbound analog RF signals may be received by the antenna elements 102. The RF front end 104 may include additional circuitry (e.g., filters, amplifiers, frequency translators) configured to perform front-end processing on the inbound RF signals. The filtered inbound RF signals may be sampled and digitized for further processing by the SDR applications running on the signal processors 110.

In embodiments, the DDR RF digitization module 106 may be fully or partially embodied on a printed control board 114 (PCB) insertable in a DDR memory slot 112 of the motherboard 108. For example, the motherboard 108 may incorporate several DDR memory slots 112 configured to receive DDR or other random-access memory (RAM) modules. The DDR RF digitization module 106 and particularly the DDR memory bus interface 116 may incorporate any appropriate DDR pinout or protocol compatible with the DDR memory slots 112 (e.g., dual inline memory module (DIMM), small outline DIMM (SO-DIMM), or other appropriate physical protocols; DDR2, DDR3, DDR4, or DDR5 synchronous dynamic RAM (SDRAM); graphics DDR (GDDR2 through GDDR6) SDRAM), particularly including a receiver-side (RX) memory bus interface 116a and a transmitter-side (Tx) memory bus interface 116b. Similarly, the DDR RF digitization module 106 may be connected to the RF front end 104 via an Rx RF connector 118 and a Tx RF connector 120.

In embodiments, the PCB 114 may incorporate various integrated circuits or chips attached thereto similarly to a DDR memory module, such that the DDR RF digitization module 106 may appear to the signal processors 110 as a read-write RAM unit in communication with the DDR memory bus 122. However, the integrated circuits or chips of the DDR RF digitization module 106 may incorporate banks of DDR analog-digital converters 124 (ADC) and digital-analog converters 126 (DAC). For example, the DDR ADCs 124 may perform high-speed digital sampling of inbound RF signals processed by the RF front end 104 (e.g., transmitting digital sampling data on both the rising and falling edges of a clock signal, in accordance with DDR signaling). The RF spectrum data digitally sampled by the DDR ADCs 124 (based on the inbound RF signals) may be provided to the signal processors 110 via the DDR memory bus 122 at optimal bandwidth with minimal latency. Similarly, digital transmissions generated by the signal processors 110 may be sampled by the DDR DACs 126 at high speed and the resulting analog RF outbound signals passed to the RF front end 104 for further processing, and finally to the antenna elements 102 for transmission.

In embodiments, the DDR RF digitization module 106 may include a DDR controller 128 configured to interface with the memory controller 110a of the SDR signal processors 110 in support of SDR caching or read/write operations. For example, cache misses or invalidations on the part of the memory controller 110a may result in a read transaction across the DDR memory bus interface 116 (e.g., from the perspective of the memory controller, this may appear as a read operation to main memory 130). In response to the read transaction, the DDR controller 128 may provide digitized RF signal data sampled by the DDR ADCs 124. Similarly, cache flush operations by the memory controller 110a may result in write transactions across the DDR memory bus interface 116, via which digital signal information generated by the signal processors 110 may be "written" to the DDR DACs 126. In some embodiments the DDR ADCs 124 may include additional read buffers 132 for buffering of the digitized RF signal information sampled by the DDR ADCs; similarly, the DDR DACs 126 may include write buffers 134 for buffering of the outbound digital signal information written to the DACs.

In some embodiments, the DDR RF digitization module 106 may incorporate additional or augmented power sources 136 on the PCB 114. For example, the augmented power sources may include additional power supply units (PSU) or power connectors (e.g., 4-pin peripheral connectors) capable of providing supplemental operating power (e.g., outside the bounds of the DDR memory bus interface 116) to the DDR ADCs 124 and/or DDR DACs 126.

Figure 2:
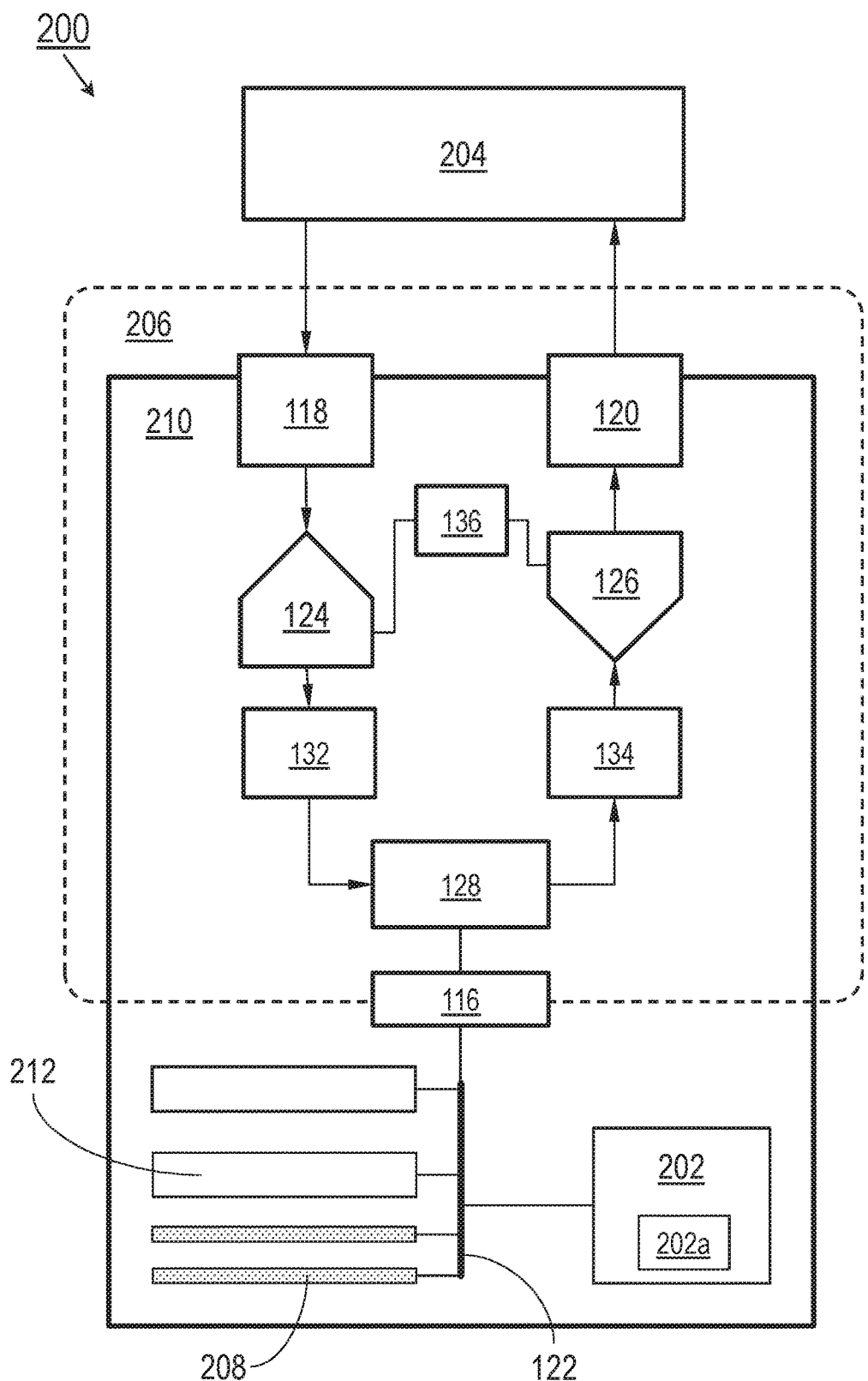
FIG. 2 is a block diagram illustrating a graphics processing environment in accordance with example embodiments of this disclosure.

Referring to FIG. 2, the graphics processing environment 200 may be implemented and may function similarly to the SDR environment 100 of FIG. 1, except that the graphics processing environment 200 may incorporate graphics processors 202 (which may incorporate memory controllers 202a) capable of processing RF signals (received from the RF signal source 204) via a single-instruction multiple-data (SIMD) processing environment.

Similarly to the RF digitization module 106 of FIG. 1, the RF digitization module 206 may be embodied on a PCB (114, FIG. 1) insertable into a DDR memory slot 208 of a graphics processing (GP) motherboard 210, and may incorporate one or more of DDR memory bus interface 116; RxRF/TxRF connectors 118, 120; DDR ADCs 124 and DDR DACs 126; DDR controller 128; read/write buffers 132, 134; and auxiliary power source 136. However, in some embodiments the RF digitization module 206 may be physically incorporated into, or fixedly attached to, a graphics processing motherboard 208 to which the graphics processors 202 are mounted. The graphics processing motherboard 208 may include DDR memory slots 210 and GDDR memory 212 inserted thereinto. In embodiments, the RF digitization module 206 may be directly connected to the DDR memory bus 122 via the DDR memory bus interface 116.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

I claim:

1. A double data rate (DDR) radio frequency (RF) digitization module, comprising:
   a printed control board (PCB) terminating in a DDR memory bus interface, the DDR memory bus interface comprising a plurality of input/output (I/O) connectors insertable into a motherboard and operably couplable to a DDR memory bus of the motherboard;
   at least one receiver (Rx) radio frequency (RF) connector couplable to an RF signal source;
   at least one transmitter (Tx) RF connector couplable to the RF signal source;
   a plurality of DDR analog-digital converters (ADC) mounted to the PCB and coupled to the Rx RF connector and to the DDR memory bus interface, the plurality of DDR ADC configured to:
     sample an inbound RF signal received from the RF signal source;
     and
     digitize the sampled inbound RF signal;
   a plurality of DDR digital-analog converters (DAC) mounted to the PCB and coupled to the Tx RF connector and to the DDR memory bus interface, the plurality of DDR DAC configured to:
     receive an outbound digital signal via the DDR memory bus interface;
     and
     generate an outbound RF signal by sampling the outbound digital signal;
   and
   at least one DDR controller communicatively couplable to a memory controller via the DDR memory bus interface, the DDR controller configured to:
     provide the digitized sampled inbound RF signal in response to at least one read operation received from the memory controller;
     and
     receive the outbound digital signal in response to at least one write operation received from the memory controller.

2. The DDR RF digitization module of claim 1, wherein:
   the plurality of DDR ADC includes at least one read buffer configured to at least partially store the digitized sampled inbound RF signal;
   and
   the plurality of DDR DAC includes at least one write buffer configured to at least partially store the outbound digital signal.

3. The DDR RF digitization module of claim 1, wherein:
   the DDR memory bus interface includes a memory-mapped interface configured to associate at least one of the DDR ADC or the DDR DAC with at least one physical address corresponding to a DDR memory in communication with the DDR memory bus.

4. The DDR RF digitization module of claim 1, wherein the DDR memory bus interface includes one of a DDR2-compatible interface, a DDR3-compatible interface, a DDR4-compatible interface, or a DDR5-compatible interface.

5. The DDR RF digitization module of claim 1, wherein the DDR RF digitization module is embodied in a dual inline memory module (DIMM).

6. The DDR RF digitization module of claim 1, wherein the DDR RF digitization module is physically incorporated into the motherboard.

7. The DDR RF digitization module of claim 1, wherein:
   the RF signal source includes at least one of:
     an RF front end including circuitry configured to modify the inbound RF signal and the outbound RF signal;
     and
     an antenna element configured for receiving the inbound RF signal;
   and
   the motherboard includes at least one signal processor associated with a software-defined radio (SDR) environment.

8. The DDR RF digitization module of claim 1, further comprising:
   at least one supplementary power supply unit (PSU) mounted to the PCB, the supplementary PSU operatively coupled to at least one of the plurality of DDR ADC or the plurality of DDR DAC and capable of supplying operating power thereto.

9. The DDR RF digitization module of claim 1, further comprising:
   at least one graphics processor mounted to the motherboard and configured to:
   generate the outbound digital signal;
   and
   process the digitized inbound RF signal;
   at least one graphics double data rate (GDDR) memory unit in communication with the graphics processor via the DDR memory bus.

10. The DDR RF digitization module of claim 9, wherein the at least one graphics processor includes a single-instruction multiple-data (SIMD) processing environment.

11. A software defined radio (SDR) device, comprising:
    at least one antenna element configured to receive an inbound radio frequency (RF) signal and transmit an outbound RF signal;
    an RF front end including circuitry configured to modify at least one of the inbound RF signal and the outbound RF signal;

a motherboard assembly comprising:
  at least one signal processor;
  at least one double data rate (DDR) memory bus in communication with the signal processor;
  at least one memory controller configured to generate at least one of a read operation or a write operation; and
  at least one DDR slot capable of accepting a memory module, the DDR slot operatively coupled to the DDR memory bus;
a double data rate (DDR) RF digitization module coupled to the RF front end by a transmitter (Tx) RF connector and a receiver (Rx) RF connector, the DDR RF digitization module comprising:
  at least one printed circuit board (PCB) terminating in a DDR memory bus interface comprising a plurality of input/output (I/O) connectors and couplable to the DDR memory bus via the at least one DDR slot;
  at least one receiver (Rx) radio frequency (RF) connector and at least one transmitter (Tx) RF connector, the RxRF connector and the TxRF connector attached to the PCB and operatively coupled to the RF front end;
  circuitry attached to the PCB, the circuitry comprising:
    a plurality of DDR analog-digital converters (ADC) coupled to the Rx RF connector and to the DDR memory bus interface, the plurality of DDR ADC configured to generate an inbound digital signal by digitizing the inbound RF signal; and
    a plurality of DDR digital-analog converters (DAC) coupled to the Tx RF connector and to the DDR memory bus interface, the plurality of DDR DAC configured to: 1) receive an outbound digital signal from the signal processor via the DDR memory bus interface; and 2) generate the outbound RF signal based on the outbound digital signal; and
  at least one DDR controller in communication with the memory controller via the DDR memory bus interface, the DDR controller configured to:
    provide the digitized sampled inbound RF signal in response to the at least one read operation; and
    receive the outbound digital signal in response to the at least one write operation.

12. The SDR device of claim 11, wherein the DDR RF digitization module further comprises:
  at least one supplementary power supply unit (PSU) mounted to the PCB, the supplementary PSU operatively coupled to at least one of the plurality of DDR ADC or the plurality of DDR DAC and capable of supplying operating power thereto.

* * * * *